(12) United States Patent
Alcoe et al.

(10) Patent No.: US 7,851,906 B2
(45) Date of Patent: Dec. 14, 2010

(54) FLEXIBLE CIRCUIT ELECTRONIC PACKAGE WITH STANDOFFS

(75) Inventors: David J. Alcoe, Hayward, WI (US); Varaprasad V. Calmidi, Binghamton, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 219 days.

(21) Appl. No.: 11/727,314

(22) Filed: Mar. 26, 2007

(65) Prior Publication Data

US 2008/0237840 A1  Oct. 2, 2008

(51) Int. Cl.
H01L 23/34 (2006.01)
(52) U.S. Cl. .............. 257/713; 257/E23.101; 257/E23.11; 257/706; 438/118; 438/122
(58) Field of Classification Search .......... 257/678, 257/687, 712, 713, 717, 706, 707, 720, E23.101, 257/E23.102, E23.11, E23.104; 361/704; 438/106, 118, 122, 125
See application file for complete search history.

(56) References Cited

U.S. PATENT DOCUMENTS

| | | | |
|---|---|---|---|
| 5,045,921 A | 9/1991 | Lin et al. | |
| 5,170,931 A | 12/1992 | Desai et al. | |
| 5,562,517 A | 10/1996 | Taylor et al. | |
| 5,673,479 A | 10/1997 | Hawthorne | |
| 5,796,590 A | 8/1998 | Klein | |
| 5,805,427 A | 9/1998 | Hoffman | |
| 5,896,651 A | 4/1999 | Hawthorne | |
| 5,930,889 A | 8/1999 | Klein | |
| 6,152,756 A | 11/2000 | Huang et al. | |
| 6,411,513 B1 | 6/2002 | Bedard | |
| 6,414,849 B1 | 7/2002 | Chiu | |
| 6,444,563 B1 | 9/2002 | Potter et al. | |
| 6,521,990 B2 * | 2/2003 | Roh et al. | 257/706 |
| 6,560,122 B2 | 5/2003 | Weber | |
| 6,631,078 B2 | 10/2003 | Alcoe et al. | |
| 6,639,360 B2 * | 10/2003 | Roberts et al. | 313/512 |
| 6,986,454 B2 | 1/2006 | Stillabower | |
| 7,071,078 B2 * | 7/2006 | Reeder et al. | 438/455 |
| 7,094,966 B2 * | 8/2006 | Bonitz et al. | 174/548 |
| 7,098,080 B2 * | 8/2006 | Takeuchi | 438/122 |
| 7,118,940 B1 | 10/2006 | Myers et al. | |
| 7,153,725 B2 * | 12/2006 | Wang et al. | 438/122 |
| 2002/0006718 A1 * | 1/2002 | Distefano | 438/617 |
| 2004/0212970 A1 * | 10/2004 | Chen et al. | 361/764 |

OTHER PUBLICATIONS

"Audio Noise Suppression Techniques—Application Note AN-24", Power Integrations, Inc., Sep., 1999, 12 pages.

(Continued)

*Primary Examiner*—Victor A Mandala
*Assistant Examiner*—Scott Stowe
(74) *Attorney, Agent, or Firm*—Mark Levy; Lawrence R. Fraley; Hinman, Howard & Kattell

(57) ABSTRACT

A flexible circuit electronic package including a heat sink, a flexible circuit having a semiconductor chip positioned thereon and electrically coupled thereto, and a quantity of heat shrunk adhesive securing the flexible circuit to the heat sink such that the flexible circuit is planar. This package is then adapted for being positioned on and electrically coupled to a circuitized substrate such as a printed circuit board. A method of making this package is also provided.

24 Claims, 3 Drawing Sheets

OTHER PUBLICATIONS

"Spheriglass Solid Glass Spheres—Spacer Application Glass Beads", Potters Industries Inc., 1 page.

"Glass Technology Today and Tomorrow—bond line spacers class VI", Mo Sci Corporation, 1 page.

* cited by examiner

FLEXIBLE CIRCUIT ELECTRONIC PACKAGE WITH STANDOFFS

TECHNICAL FIELD

This invention relates to electronic packages and particularly to such packages which include one or more flexible circuit members as part thereof.

BACKGROUND OF THE INVENTION

Flexible (or "flex") circuit electronic packages typically include one or more flex circuit members each including at least one thin layer of dielectric (e.g., polyimide) with a pattern of conductors (e.g., copper pads) positioned on a surface thereof designed to accommodate a semiconductor chip (also referred to herein simply as a chip) thereon which is electrically connected to the conductors (e.g., using solder balls) and thereby to other circuitry of the flex circuit which is also coupled to the conductors. This flex circuit in turn is designed for being mounted on another circuitized substrate, typically in the form of a multilayered printed circuit board (also referred to herein simply as a PCB). The printed circuit board in turn typically includes a dielectric substrate (e.g., organic resin material reinforced by fibers, also referred to in the PCB industry as "FR-4" material) and multiple layers of electrically conductive circuit traces as well as ground and power layers. Many flex circuit electronic packages utilize solder balls to also couple the flex circuit to the respective conductors of the host PCB.

When positioning and electrically coupling a chip to a flex circuit using solder balls, some amount of flex circuit warping will occur, which is undesirable from both manufacturing and product functioning standpoints. This warping occurs because the flex circuit is of an extremely thin (e.g., sometimes having an overall thickness of only about 8 mils (a mil being a thousandths of an inch) to 25 mils) polymer dielectric material, and is thus very susceptible to bending from the heat generated during the solder reflow process required to form the chip-flex bond. Various attempts, some defined in greater detail below, have been undertaken to prevent such warping. One particular example of such an attempt is to use what is referred to as a "stiffener" or "lid", which are typically of rigid metal construction and usually secured to the flexible circuit at some location (e.g., about the outer periphery). Adding these members to such packages also often necessitates usage of additional processing fixtures, thereby adding to the cost of the final package. As flexible circuits become thinner and thus more flexible (due to increased demands for miniaturization in today's products using these packages), it is desirable to increase planarity of the flexible circuit without the need for such added members and processing.

As understood from the following, the present invention represents what is believed is a significant improvement in approaches to assuring effective planarity of the flex circuit relative to the coupled chip, and thus also relative to a host PCB to which it is to be coupled. Such planarity is essential to assuring a sound connection between the many conductors of the flex and those of the underlying host PCB when solder ball connections are being used, especially when highly dense patterns of such conductors are utilized. In some of today's patterns, for example, the conductors of a flex circuit and those of the accommodating PCB may be so closely spaced that the center-to-center spacings between such conductors is only from about 12 mils to 50 mils. As defined herein, the invention is able to provide such planarity without the need for a "stiffener" or "lid" as required in many prior art products.

The following U.S. Patents describe various approaches to providing desired spacings between electronic package and the like structures. The citation of these patents is not an admission that any are prior art to the present invention.

In U.S. Pat. No. 5,045,921, there is described an electronic pad array carrier device for mounting on a printed circuit board or flex circuit substrate, the device having a thin, flexible "tape" substrate having a plurality of traces. The substrate may be polyimide or other material that can withstand relatively large lateral mechanical displacement. An integrated circuit die is mounted in proximity with or on the substrate and electrical connections between the integrated circuit chip and the traces are made by any conventional means. The substrate traces are provided at their outer ends with solder balls or pads for making connections to the PCB. A package body covers the die, which body may be optionally used to stand off the package a set distance from the PCB so that the solder balls will form the proper concave structure. Alternatively, a carrier structure may be provided around the periphery of the substrate to add rigidity during handling, testing and mounting, but which may also provide the stand-off function. The thin, flexible substrate can absorb a relatively large lateral or even vertical mechanical displacement over a rather large package area. The substrate may be optionally transparent or translucent to permit inspection of the bonds after mounting to the PCB. The PCB or flex circuit may also be transparent or translucent for bond inspection purposes. The solder pads or balls may be joined to a via through the substrate at least partially filled with electrically conductive material to permit back side testing of the carrier before or after mounting of the package to the PCB. Additionally, a heat sink structure may be directly bonded to the die in the pad array carrier IC device.

In U.S. Pat. No. 5,170,931, there is described a method and apparatus for mounting a flexible film semiconductor chip carrier on a second level electronic package. The resulting electronic packaging structure includes electrically conductive spacers, such as solder balls or solder coated copper balls, which electrically interconnect outer lead bonding pads on the flexible film semiconductor chip carrier and corresponding bonding pads on the second level electronic package, and which physically support the flexible film of the semiconductor chip carrier substantially in a plane above the surface of the second level electronic package. This electronic packaging structure is made using a special assembly fixture comprising a base plate, a pressure insert with a resilient member, and a top plate. The flexible film semiconductor chip carrier with the spacers attached thereto is placed over the resilient member of the pressure insert which is clamped together with the second level electronic package between the top and base plates. Then, this assembly is heated to reflow the solder of the spacers, and the assembly fixture is disassembled, leaving the flexible film semiconductor chip carrier mounted on the second level electronic package with the flexible film of the carrier having a planar geometry as desired. The spacers may be attached to the flexible film semiconductor chip carrier using a special template having a pattern of openings corresponding to the pattern of outer lead bonding pads on the flexible film semiconductor chip carrier.

In U.S. Pat. No. 5,562,517, there is described a spacer for use in a field emission device which comprises a comb-like structure having a plurality of elongated filaments joined to a support member. The filaments, which may be glass, are positioned longitudinally in a single layer between the facing surfaces of the anode structure and the electron emitting structure. Support member is positioned entirely outside the active regions of anode structure and emitting structure. The spacer provides voltage isolation between the anode and cathode structures, and also provides standoff of the mechanical forces of vacuum within the assembly.

In U.S. Pat. No. 5,673,479, and in U.S. Pat. No. 5,896,651 (a divisional of U.S. Pat. No. 5,673,479), there is described a Tape-Automated-Bonding (TAB) package which includes a resilient polyimide layer that supports a metal lead-frame. A microelectronic circuit die is mounted in a hole in the polyimide layer and interconnected with inner leads of the lead-frame. The TAB package is adhered to a support member having spacers that abut against the surface of a printed circuit board on which the package is to be mounted and provide a predetermined spacing between the lead-frame and the surface. Outer leads that protrude from the lead-frame are bent into a shape so as extend, in their free state, toward the surface at least as far as the spacers. The package and support member assembly is placed on the PCB surface, and the combination of the weight of the assembly, the resilience of the leads and the preset standoff height enable the leads to resiliently deform so that the spacers abut against the surface and the leads conformably engage with the surface for soldering or other ohmic connection to conjugate bonding pads on the surface. The support member can be formed with lead retainers around which the leads extend to form loops that resiliently and conformably engage with the surface as the assembly is lowered thereon. The support member maintains co-planarity, adds weight to the package, pre-sets the standoff to protect the formed outer leads during surface mounting and enables the package to be shipped without a separate carrier.

In U.S. Pat. No. 5,796,590, and in U.S. Pat. No. 5,930,889 (a divisional of U.S. Pat. No. 5,796,590), there is described an apparatus and method for surface-mounting ball grid array integrated circuit (IC) devices to printed circuit boards. A thin single- or multi-layer sheet of nonconductive material having a plurality of apertures corresponding to the leads of the IC device to be mounted is interposed between the ball grid array and the circuit board prior to solder processing to facilitate solder application, device alignment, and solder retention. An assembly guide is located on the top surface of the aid to assist in the orientation and placement of the IC device during assembly. In a further aspect, the disclosed assembly aid helps compensate for non-planarity in the IC device array or circuit board, and maintains a minimum standoff distance between the IC package and the circuit board to preclude undue solder joint deformation. The assembly aid also allows for reworking of the surface mount by facilitating localized placement of the solder prior to reflow processing without masking or other additional processing steps.

In U.S. Pat. No. 5,805,427, there is described a surface mount package to encapsulate one or more semiconductor devices which has a standoff that maintains the thickness of solder columns bonding the package to an external circuit. The standoff either extends over or circumscribes a central portion of the package base. To enhance the thermal performance of the standoff, a solderable layer enhances soldering of the standoff to the external circuit. In alternative embodiments, the standoff contains a flange having a plurality of apertures useful for either mechanically locking an adhesive or for enabling irradiation of an adhesive by a light source. The standoff may contain protrusions for alignment, strength or circuit routing.

In U.S. Pat. No. 6,152,756, there is described a socket for interconnecting an electronic package with a circuit board which comprises a base, a cover slidably attached to the base, and supporting means downwardly extending from the base. The base comprises a pair of extension plates diagonally extending there-from. The supporting means in the form of a pair of standoffs is formed on the respective extension plates. Since each standoff has a height slightly smaller than that of solder balls formed on a lower surface of the base, the standoffs rest on the circuit board after the socket is soldered thereto. By such a design, the external force employed to actuate the cover to slide along the base is transferred from the base to the standoffs. Hence, deformation of the base and damage to the solder joint are obviated to ensure a reliable connection between the PGA package and the circuit board.

In U.S. Pat. No. 6,411,513, there is described a compliant, thermally conductive interface device for use between two surfaces, such as a component and a heat sink surface, that can accommodate a range of gap distances and angular misalignment (tilt). The device is comprised of a plurality of foils stacked in a densely-packed, nested fashion. The foils may extend between the surfaces. Embodiments are described for use with flat, two-dimensionally curved, three-dimensionally curved, and cylindrical surfaces (such as heat pipes). Preferably, the foils are pre-formed in a shape corresponding to their fully compressed shape in a device and stacked directly against each other. After bonding the plurality of adjacent foil proximal edges together and the plurality of adjacent foil distal edges together, the assembly is extended to produce interstitial separation distances between adjacent foil flexing sections to accommodate future flexing and the height to accommodate future compression and tilt.

In U.S. Pat. No. 6,414,849, there is described a low stress, low profile, cavity down wire bond or flip-chip BGA package which is formed by injection molding or thermosetting of liquid crystal plastic (LCP) to form a die carrier including a polymer solder grid array (PSGA) of standoff posts formed during molding of the die carrier. The standoff posts are coated with copper during plating of the die carrier, on the surfaces of which conductive traces are etched from the standoff posts into a die cavity, including on the sidewalls of the die cavity, to wire bond sites or small solderable areas at the bottom of the cavity. After mounting of a wire bond or flip-chip integrated circuit die within the die cavity of the die carrier, the packaged integrated circuit is mounted on a main printed circuit board substrate utilizing conductive paste to electrically connect the standoff posts to conductive solderable areas on the main PCB substrate. The high aspect ratio and/or large height of the plated standoff posts reduces stress on the solder joints and, combined with the flexibility of the LCP die carrier, improves solder joint reliability after reflow and during operation.

In U.S. Pat. No. 6,444,563, there is described a ball grid array or chip scale package integrated circuit which is manufactured by first identifying the most unreliable solder ball joints in the IC. These worst case joints, or joints in the vicinity of the worst case joints, are changed in pad dimension and exposed to more ball/bump conductive material than the other more robust joints in the IC to create a ball on a larger pad that is larger than the normal sized ball. The larger balls are formed by placing multiple smaller balls together on a single pad to form one larger ball during a reflow operation. The larger ball improves the overall IC reliability by improving the reliability of the weakest joints in the IC design. In addition, the standoff of both the larger balls and the smaller balls are engineered to be substantially equal.

In U.S. Pat. No. 6,560,122, there is described an integrated circuit chip package which includes an integrated circuit chip that is mounted on a substrate by a reflow process and by a plurality of solder bumps. At least one standoff is located between the circuit chip and the substrate to maintain a distance between the circuit chip and the substrate during the reflow process. A mold compound is used for under-filling air gaps between the chip and the substrate. The integrated circuit chip package is formed by placing the chip and substrate within a mold cavity and pressing a transfer mold compound into the mold cavity. Air spaces between the integrated circuit chip and the substrate are under-filled by the mold compound as it is pressed in between the integrated circuit chip, the standoffs and the substrate. Air is allowed to escape from between the chip and the substrate during the under-filling through a vent which extends through the substrate. The under-filling material may also be used to encapsulate the chip at the same time that under-filling is performed.

In U.S. Pat. No. 6,631,078, there is described a heat dissipating flexible or resilient standoff which is mechanically clamped between an electronic module and substrate, such as, PCB. The clamping arrangement comprises a heat sink compressing a thermally conductive flexible interface pad over the upper surface of the electronic module by way of mechanical linkage to the PCB. The heat dissipating flexible standoff provides a force opposing the compression force to thereby reduce stress on solder ball connections between electronic module and PCB. Thermally conductive flexible standoffs in the form of spring arrangements, such as a wire mesh, act to provide heat dissipation by both thermal conduction and thermal convection. A thermally conductive flexible polymer pad and a layer of porous metal foam may also act as thermally conductive standoffs.

In U.S. Pat. No. 6,986,454, there is described an electronic package which includes a circuit board having a substrate and circuitry and a surface mount device having a contact terminal. A mounting pad is formed on the circuit board. The electronic package also includes a solder joint connecting the contact terminal of the surface mount device to the mounting pad on the circuit board. The solder joint includes a reflowable solder and a plurality of stand-off members. The stand-off members provide a separation distance (H) between the circuit board and surface mount device in the range of about 0.01 mm to 0.10 mm.

In U.S. Pat. No. 7,118,940, there is described an electronic package having a controlled standoff height between a surface mount device and a circuit board. The electronic package includes a circuit board having a substrate and circuitry including mounting pads and a surface mount device having circuitry and contact terminals. Solder joints connect the contact terminals of the surface mount device to the mounting pads on the circuit board. A dielectric under-fill is disposed between the circuit board and the surface mount device, and a plurality of standoff members are disposed in the under-fill material to provide a separation distance between the circuit board and the surface mount device.

As defined herein, the present invention is able to assure effective planarity of the flex circuit relative to the chip bonded thereto (and to other components of the package, if necessary). The invention is able to accomplish this without using a stiffener or similar member which has heretofore been essential in many electronic packages, such a stiffener being bonded directly to the flex (e.g., along a large portion of the outer periphery). Still further, the invention is able to accomplish this without using complex and costly elements and/or processing equipment, thus allowing the manufacturer of the invention to pass on cost savings to the package consumer. It is believed that such a package will represent a significant advancement in the art.

OBJECTS AND SUMMARY OF THE INVENTION

It is a primary object of the present invention to enhance the flexible circuit electronic package art.

It is another object of the invention to provide an enhanced flexible circuit electronic package which can be produced in a facile and relatively inexpensive manner, using, for the most part, conventional equipment.

It is yet another object of the invention to provide a method of making such an electronic package.

According to one aspect of the invention, there is provided an electronic package comprising a heat sink, a flexible circuit including a plurality of conductors thereon, a semiconductor chip positioned on the flexible circuit and electrically coupled to selected ones of the conductors, a quantity of heat shrunk adhesive positioned on the flexible circuit and bonding the flexible circuit to the heat sink such that the flexible circuit having the semiconductor chip positioned thereon is substantially planar, and a plurality of standoffs positioned between the heat sink and flexible circuit to maintain at least part of the flexible circuit at a spaced distance from the heat sink.

According to another aspect of the invention, there is provided a method of making an electronic package comprising providing a heat sink, providing a flexible circuit including a plurality of conductors thereon, positioning a semiconductor chip on the flexible circuit and electrically coupling the chip to selected ones of the conductors, positioning a quantity of heat shrinkable adhesive in liquidus form between the flexible circuit and heat sink and in contact with both the flexible circuit and heat sink, substantially curing the heat shrinkable adhesive to cause it to shrink from the volume of its liquidus form to a lesser volume so as to bond the flexible circuit to the heat sink such that the flexible circuit having said semiconductor chip positioned thereon is substantially planar, and positioning a plurality of standoffs substantially between the heat sink and flexible circuit to maintain at least part of the flexible circuit at a spaced distance from the heat sink when the flexible circuit is substantially planar.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "electrical assembly" as used herein is meant the combination of at least one electronic package and at least one printed circuit board (or PCB), the package positioned on and electrically coupled to the printed circuit board.

By the term "electronic package" as used herein is meant at least one flexible (or flex) circuit having at least one semiconductor chip thereon and at least one heat sink, the chip being thermally coupled to the heat sink.

By the term "flexible circuit" or "flex circuit" as used herein is meant at least one thin dielectric layer of material having circuitry as part thereof. By the term "thin" is meant an individual dielectric layer having a total thickness of from about 1 mils to about 8 mils, as part of a flex circuit having a total thickness from about 1.2 to about 30 mils, depending on the layer content. The circuitry will include a pattern of conductors typically in the form of pads which are typically formed on a surface of the dielectric layer, in which case the conductors will have a thickness of from only about 0.2 to about 1 mil. Such circuitry is typically metallic, such as of a copper or copper alloy.

By the term "heat shrinkable adhesive" as used herein is meant an adhesive material which may be applied in substantially liquidus form and thereafter cured such that the material will then shrink from its original volume in said liquidus form to a lesser volume. By the term "heat shrunk adhesive" as used herein is meant a heat shrinkable material which has been so cured and has shrunk from its liquidus volume to said lesser volume.

By the term "printed circuit board" or "PCB" as used herein is meant a multilayered structure comprised of two or more dielectric layers and two or more conductor layers oriented in an alternating manner. The conductor layers are typically of metal, a common metal being copper or copper alloy. Such structures often include many more than two each of the dielectric and conductor layers, and also often include a conductor layer on the top surface thereof. This upper conductor layer may in turn include a pattern of conductors designed to accept a chip thereon.

Figure 1:
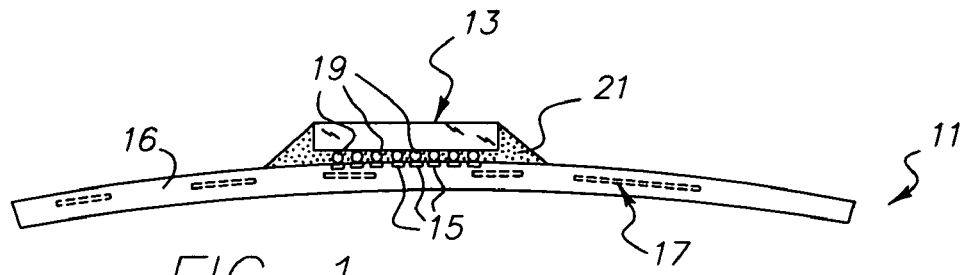
FIGS. 1-3 are side elevational views (FIGS. 2 and 3 also being partly in section) which illustrate various prior art means for coupling a flexible circuit to a semiconductor chip.
Figure 2:
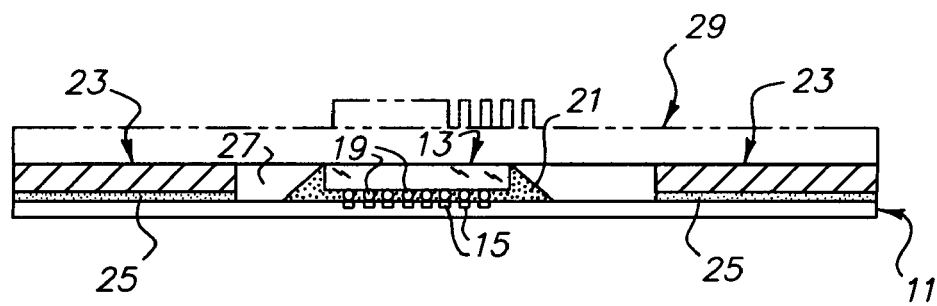
Figure 3:
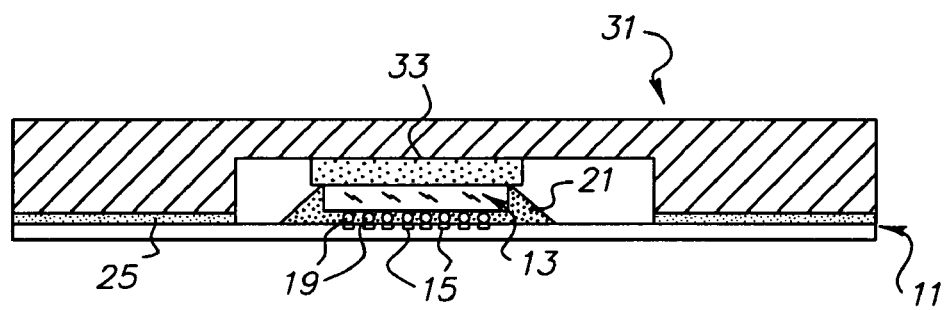

FIGS. 1-3, identified as "Prior Art", represent three examples of flexible circuit electronic packages known in the art. FIG. 1 illustrates the simplest form, this being a single flexible circuit 11 and a chip 13 positioned thereon and coupled thereto. That is, the flex includes a plurality of conductor pads 15 which are in turn are electrically connected to other circuit lines (not shown) which form part of the package's circuitry. Such circuitry may also include internal conductor layers 17 (only one shown in FIG. 1), each of which may include multiple signal lines. In cross section, a single layer 17 may be seen as including several spaced apart sections, as in FIG. 1, with these in turn being coupled to one another in various patterns, as is known in the art. As mentioned above, the flex circuit also comprises at least one dielectric layer 16 (two in FIG. 1, one on each side of layer 17), which, in one embodiment of the invention, is of a conventional polyimide material. Further examples of dielectric materials usable for this flexible circuit (and the others defined herein) include fiberglass-reinforced epoxy resins (some referred to as "FR4" dielectric materials in the art, for the flame retardant rating of same), polytetrafluoroethylene (e.g., TEFLON® material), polyamides, cyanate resins, photo-imageable materials, and other like materials. Examples of conductor materials usable in the circuitry of such circuits, including those of the instant invention, include copper or copper alloys, but may include additional metals (e.g., nickel, aluminum, gold, etc.) or alloys thereof. In many embodiments, including those of the present invention, the chip is bonded to the respective conductors 15 using solder balls 19, which may be of conventional solder compositions. In one example, a solder composition of 63% tin and 37% lead may be used. Finally, the chip (or chips if more than one are to be coupled to the flex circuit) is substantially encased (excluding its upper surface) in a suitable encapsulant material 21, several of which are also known in the art.

In FIG. 1, it is seen that simple bonding of the flex circuit 11 to chip 13 results in warpage of the thin flexible circuit, to the extent it is not planar. Such warpage is substantially exaggerated in FIG. 1 for illustration purposes. To overcome this undesirable orientation, one approach has been to utilize a stiffener 23 (or lid) as mentioned above, typically of metal material (e.g., aluminum) which is bonded to the flex circuit 11, i.e. using a quantity of a known adhesive 25. The stiffener may be of a picture frame configuration, as shown, with an opening 27 therein designed to accommodate the chip. While flex circuit planarity is possible using this construction, it is seen that the stiffener occupies a relatively large portion of the circuit's upper surface, which could otherwise be utilized for additional functions, including the positioning of more chips. As also stated, positioning of this member necessitates the use of additional processing fixtures, adding more cost to the end product. Still further, such a package as shown in FIG. 2 (and FIG. 1) will typically require still another added member, a heat sink 29 (shown in phantom in FIG. 2) to which the chip is thermally coupled for enhanced heat escape (and prolonged life) for the chip. Heat sink 29 is of any known configuration, and not limited to the configuration shown in FIG. 2. Such members also often include a number of upstanding fins or the like, with only a few of these being shown in the representative example in FIG. 2. The chip in FIG. 2 is thermally bonded to this heat sink using a quantity of known thermal adhesive (not shown) to thereby provide a direct path for heat transfer from the chip to the heat sink (and then to the external environment).

The prior art embodiment of FIG. 3 represents an alternative version of the FIG. 2 structure in that a combined heat sink-stiffener 31 is utilized and bonded to the flex circuit, as shown. As with the combination of a heat sink and separate stiffener in FIG. 2, the result is a relatively large package structure, with much of the flex circuit's upper surface occupied. The chip 13 is thermally bonded to the undersurface of a cavity portion of the heat sink-stiffener 31 using a conventional thermal adhesive 33. The embodiment of FIG. 3 includes other elements similarly to the FIG. 2 embodiment.

The above prior art embodiments are meant to be representative only and not meant to be exhaustive of the many different approaches used to attain flex planarization in the final structure.

Figure 4:
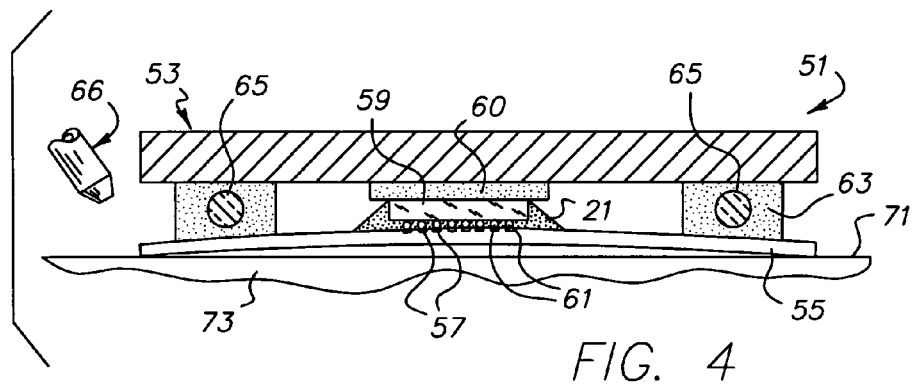
FIGS. 4 and 5 are side elevational views, partly in section, of a flexible circuit electronic package according to one embodiment of the invention.

In FIG. 4, there is shown an electronic package 51 according to one embodiment of the present invention. Package 51 includes a heat sink 53, a flexible circuit 55 including a plurality of conductors 57 thereon, a semiconductor chip 59 positioned on flexible circuit 55 and electrically coupled to selected ones of conductors 57 (the chip including conventional contact sites (not shown) which in turn are coupled to respective ones of the conductors 57 by a plurality of solder balls 61 of conventional solder composition), a quantity of heat shrinkable adhesive 63 positioned on flexible circuit 55 for bonding the flexible circuit to heat sink 53 and a plurality of standoffs 65 positioned between heat sink 53 and flexible circuit 55. In one embodiment, chip 59 is thermally bonded to heat sink 53 by a quantity of thermal paste 60, several different types of which are known in the art. In one embodiment, a thermal paste sold under the product name Thermal Interface Material X23-7783D available from Shin-Etsu MicroSi, Inc., having a place of business at Phoenix, Ariz., may be used. This particular paste has a viscosity (Pascal Second) of 200, a specific gravity of 2.6 and a thermal conductivity rating (W/m degrees Kelvin) of 6.0. The heat shrinkable adhesive 63 may be dispensed in liquidus form to its shown position using a suitable dispenser nozzle 66, the adhesive adapted for being so dispensed using such a device. One example of a heat shrinkable adhesive usable in the invention is sold under the product name "TSE3281-G", a thermally conductive, heat curable silicone adhesive available from the General Electric Company, having a place of business at Nela Park, Ohio. This adhesive has a viscosity (Pascal Second) of 60, a specific gravity of 2.70 and a thermal conductivity rating (W/m degrees Kelvin) of 1.68. It also has an elongation value of 50 percent. Typical cure times for this adhesive are one hour if heated to 150 degrees C., two hours at 125 degrees C., and four hours at 100 degrees C. Other adhesives adapted for use with the invention include Thermally Conductive Adhesive 1-4173, sold by Dow-Corning Corporation, having a place of business at South Saginaw Road, Midland, Mich. 48686, and Thermal Conductive Adhesive 1-4174 and Thermally Conductive Adhesive SE4486CV, also sold by Dow-Corning. Thermally Conductive Adhesive 1-4174 includes glass spacer beads of 0.007 diameter. This listing is not meant to be exhaustive, as others are also possible. It is also possible using the teachings herein to bond chip 59 to heat sink 53 using a heat shrinkable adhesive rather than the above mentioned paste 60, including using the same adhesive as used for adhesive 63. Using similar adhesives for bonding the chip to the heat sink and between the flex circuit and heat sink with these being at different thicknesses allows for proportional shrinkage in these parts of the FIG. 4 structure (as well as others below). For example, using adhesive to bond the chip having a thickness of about two to about six mils in place of paste 60, and an adhesive 63 with a thickness of about twenty to about fifty mils thick, will allow proportional shrinkage (the thicker adhesive shrinking greater than the counterpart, much thinner chip adhesive) while assuring the planarity of the flex circuit as required. This proportional shrinkage capability is deemed a significant feature of the present invention.

Significantly, the orientation of the flexible circuit 55 in FIG. 4 represents its initial orientation of the circuit relative to heat sink 53, it previously having been secured to chip 59 as a result of a solder re-flow process in which the solder balls 61 are heated to the melting point thereof and then cooled to solidify. In one embodiment, such heating is to a temperature of at least about 183 degrees Celsius. Heat shrinkable adhesive 63 is then dispensed about the outer periphery of the flexible circuit during which it also contacts the undersurface of heat sink 53. At this time, standoffs 65, which in one embodiment are glass spheres, are positioned within the shrinkable adhesive in a spaced orientation about the flex circuit's periphery. In one example, a rectangular shaped flex circuit includes sixteen standoffs 65 positioned about the circuit's periphery. In said embodiment, each standoff may include a diameter of about 30 mils, which understandably is to serve as the final spacing between heat sink 53 and the flexible circuit, this final orientation shown in FIG. 5. Standoff positioning within the adhesive may be accomplished using various locating mechanisms (not sown), including tweezer-type holders, automated robotic grippers, etc. In the aforementioned immediately preceding embodiment, a total quantity of 0.7 grams of adhesive 63 may be used, and a quantity of 200 micrograms of adhesive 60 may be used. At this initial positioning as shown in FIG. 4, the spacing between heat sink 53 and circuit 55 is approximately 35 mils on average, which is 5 mils larger than the corresponding diameters of the spherical standoffs. In the FIG. 4 embodiment as described, heat sink 53 may be of copper, aluminum, alumina-silica-carbide, stainless steel or other sound thermally conductive material. If intended primarily as a member for assuring planarity for the package with respect to its chip and circuit members, it may also be of ceramic, glass, silicon carbide, glass, quartz or combinations thereof. In this embodiment, it may have a thickness of about twenty mils, and may also include fins (not shown) or the like, several types of which are known in the art. Flexible circuit 55 is of one or more of the materials mentioned with respect to the FIGS. 1-3 Prior Art embodiments. It may also include one or more internal conductive layers, these not shown in FIG. 4 for ease of illustration.

In FIG. 4, the flexible circuit 55 of package 51 is shown as being positioned on a flat surface 71, e.g., of a table 73 or other supporting member. As such, the flexible circuit is bowed upwardly in a convex orientation relative to heat sink 53 as a result of its initial orientation following attachment to chip 59. That is, the portion of the circuit having chip 59 secured thereto is closest to the heat sink, while the outer peripheral portions of the circuit are farther from the heat sink. This bowing (or curvature) is shown in a grossly exaggerated manner for illustration purposes, and is not meant to illustrate the only non-linear orientation the flex may assume. Others, including minor waveform orientations, or even where one side is closer to the heat sink than the other, e.g., tilt, are possible.

Figure 5:
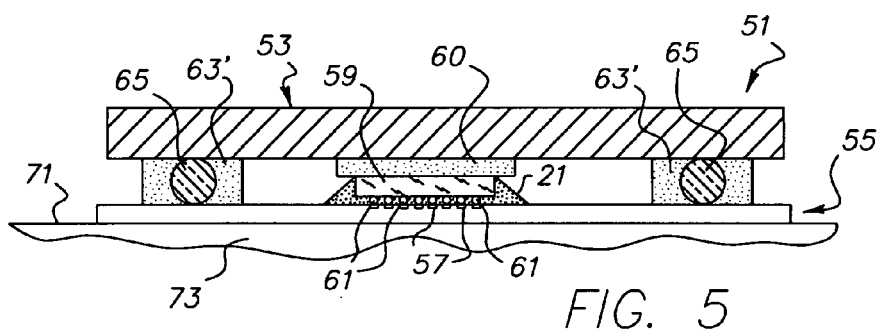

In FIG. 5, package 51 is shown following a predetermined period in which adhesive 63 has been allowed to "cure." In the case of the "SE4486CV" thermally conductive adhesive cited above, and in which the quantity of 0.8 grams have been dispensed, this time period is about 120 hours. Such curing was possible by exposing package 51 to a room temperature environment, without excessively high or low humidity being present. For a more rapid cure, however, it is preferred, to heat the structure of FIG. 4 to a temperature of from about 140 degrees Celsius to about 160 degrees Celsius, and in one particular embodiment using TSE3281-G, a temperature of 150 degrees Celsius, as a means to accelerate the curing process. At such temperatures, and using a convection oven in which the structure is placed, the curing may be accomplished within a time period of from about 30 minutes to about 120 minutes. At the particular example of 150 degrees Celsius, full cure may be attained at about 60 minutes. Surprisingly, it is possible to heat the structure to a temperature of about eighty to eighty-five percent of the melting point temperature of the solder used to bond the chip to the flex circuit, without harming the thin flex circuit itself. This heating (and thus expedited curing of the adhesive) is possible using a flex circuit material (here, polyimide) with a higher melting point than the solder. The polyimide usable in this invention may possess a melting point of as high as 300 degrees Celsius. Of further significance, as a result of this "curing", the adhesive shrinks (in one example, from about 10 percent to about 30 percent from its original volume), drawing the flexible circuit 55 closer to the heat sink until stopped by the strategically positioned standoffs 65. The invention is thus able to attain planarity of the flexible circuit 55 without using a stiffener or the like metal member as described above which must be secured directly to the flex circuit.

In the substantially cured FIG. 5 orientation, flex circuit 55 is uniformly spaced from the also planar heat sink a distance of 30 mils about the full width of the heat sink (and flex circuit). Both heat sink and flex are thus coplanar, to thereby assure substantially equal spacing of the relatively delicate solder balls connections to the corresponding conductors 57 and the associated contact sites of chip 59.

Figure 6:
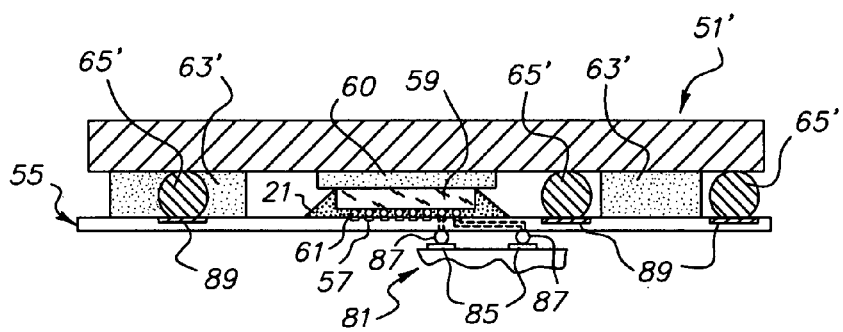
FIGS. 6-8 are side elevational views, partly in section, which illustrate flexible circuit electronic packages according to alternative embodiments of the invention.

In FIG. 6, there is shown another embodiment of this invention. Package 51' includes similar elements as package 51 in FIG. 5, except that selected ones of the standoffs 65' are positioned externally of the heat shrunk adhesive 63' (while some, i.e., represented by the one to the left in FIG. 6) are positioned within the adhesive. Standoffs 65' within the adhesive may be positioned similarly as standoffs 65 in FIG. 5, with those shown internally of the adhesive positioned prior to adhesive dispense, e.g., using a temporary adhesive (not shown). Those along the outer portion of the adhesive are positioned following adhesive dispense, again possibly using a temporary adhesive to maintain these in place. Curing of the adhesive 63' then occurs, during which the adhesive will shrink and the flex circuit 55 will draw tight as did circuit 55 in FIG. 5. Similar quantities of adhesive, as well as elements of similar materials and dimensions as in FIG. 5 may be utilized.

The FIG. 6 embodiment is also provided in greater detail to illustrate the possible coupling (electrically) between the flex circuit 55 and an underlying printed circuit board 81. Such coupling may be accomplished using thru-hole and/or internal circuitry as shown in hidden in FIG. 6, to couple the conductors 57 (again using solder balls 61 to couple the chip to the flex circuit) to corresponding conductors 85, using solder balls 87 at the respective connection locations. These solder balls 87 may be of the same or different solder composition as solder balls 61. Of further significance, the standoffs 65' may be of metal (e.g., stainless steel, copper or aluminum spherical members, as well as higher temperature melting point solder balls than solder balls 61 and 87) and electrically connected to corresponding conductors 89 on the flex circuit's upper surface. Being of metal or other electrically conductive material (e.g., cured epoxy spherical elements having therein metallic, e.g., silver, particles), the standoffs may thus provide an electrical connection to the heat sink (e.g., to provide a ground) as well as a thermal connection (e.g., to enhance heat escape from the enclosed, interior portion of the package. It is understood that the standoffs may also be of non-conductive material, including of the glass material used for standoffs 65 above (or, alternatively, of ceramic), and not necessarily provide conductive paths. Briefly, the standoffs of the invention may be of organic or inorganic material, as well as other construction as defined below. Thus, practically any material or structure may be utilized, provided it is able to maintain its overall thickness as a result of the shrinking of adhesive 63 or 63'.

Figure 7:
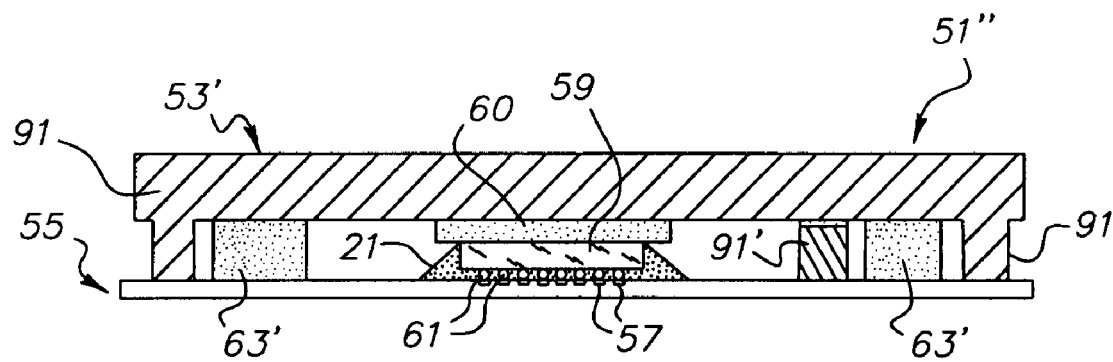
Figure 8:
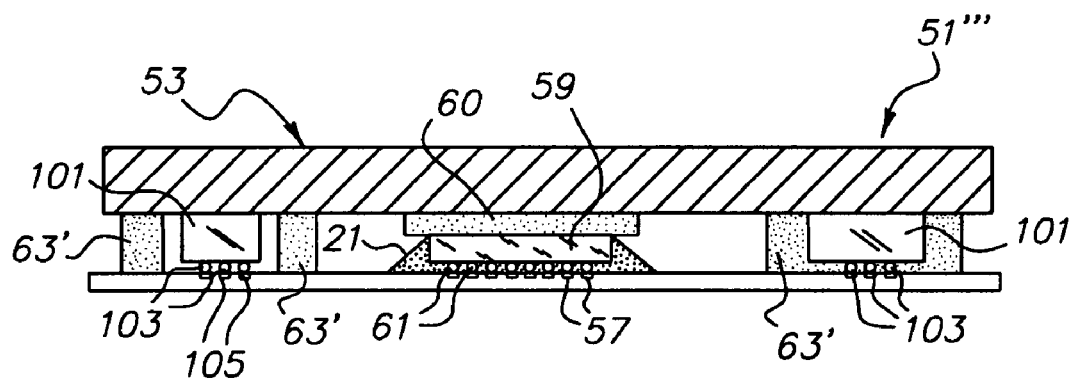

FIGS. 7 and 8 represent still further embodiments of the invention. In FIG. 7, heat sink 53' includes extension portions 91 of a predetermined length with adhesive 63 dispensed internally thereof. The adhesive shrinks as above, drawing the flexible circuit upwardly and against these extension portions until it assumes a planar shape as shown. As a possible alternative (or in combination with portions 91), separate extension portions 91' may be used. These may be in the form of separate metal members, e.g., cylindrical or boxlike, strategically oriented internally and/or externally of the projection extension portions 91 (if used) relative to chip 59, or as separate stand alone members. Portions 91 and 91' may be contiguous to or spaced from adhesive 63'.

In the FIG. 8 embodiment, electronic components in the form of semiconductor chips 101 may be used as the invention's standoffs. Chips 101 may be secured to the upper surface of flex circuit 55 using solder balls 103, which in turn may be coupled to upper conductors 105 (shown only to the left in FIG. 8) on the flex. Significantly, chips 101 are also fully functional in this arrangement to thus provide package 51''' with multiple chip capabilities. These chips and the associated solder connections as shown are able to maintain their shape (and thickness) during adhesive shrinking, without adversely affecting (damaging) the chip or its connections. The invention is thus able to provide precise spacing between the heat sink and flex circuit while also providing more than one chip as a functioning member of the package. Chips 101 may be positioned within the adhesive or externally thereof, as represented in FIG. 8.

Thus there has been shown and defined an electronic package in which a flex circuit is maintained at a precise spaced distance from a heat sink, with respect to at least a major portion thereof. This spacing is attained in a new and unique manner, by allowing a heat shrinkable adhesive to shrink and thus draw the previously non-planar flex circuit to a planar configuration. Various standoff members may be used, and of a variety of different materials and shapes. The invention as defined is relatively easy to produce and thus adaptable to mass production. The elements use are also of relatively inexpensive materials (e.g., metal and glass) for the most part, but it is also possible to utilize additional electronic components such as the semiconductor chips shown above, for this purpose.

While there have been shown and described what are at present the preferred embodiments of the invention, it will be obvious to those skilled in the art that various changes and modifications may be made therein without departing from the scope of the invention as defined by the appended claims.

What is claimed is:

1. An electronic package comprising:
   a heat sink; a flexible circuit including a plurality of conductors thereon;
   a semiconductor chip positioned on said flexible circuit and electrically coupled to selected ones of said conductors; a quantity of heat shrunk adhesive positioned on said flexible circuit and bonding said flexible circuit to said heat sink such that said flexible circuit having said semiconductor chip positioned thereon is substantially planar; and
   a plurality of separate standoffs positioned between said heat sink and said flexible circuit to separately contact and maintain at least part of said flexible circuit at a spaced distance from said heat sink, so as to limit motion of said flexible circuit due to permanent volumetric shrinkage of heat shrunk adhesive; wherein at least one of the plurality of separate standoffs does not contact the heat shrunk adhesive, and wherein at least one of said plurality of separate standoffs is positioned within said quantity of heat shrunk adhesive.

2. The electronic package of claim 1 wherein said separate standoffs comprise inorganic material.

3. The electronic package of claim 2 wherein said separate standoffs comprise glass.

4. The electronic package of claim 1 wherein said separate standoffs comprise of metal.

5. The electronic package of claim 4 wherein said separate standoffs are solder elements.

6. The electronic package of claim 1 wherein said separate standoffs are electronic components.

7. The electronic package of claim 6 wherein said separate standoffs are semiconductor chip and solder ball assemblies.

8. The electronic package of claim 1 wherein at least one of said separate standoffs is positioned contiguous to said quantity of heat shrunk adhesive.

9. The electronic package of claim 8 wherein said separate standoffs comprise of inorganic material.

10. The electronic package of claim 9 wherein said separate standoffs comprise of glass.

11. The electronic package of claim 8 wherein said separate standoffs comprise of metal.

12. The electronic package of claim 11 wherein said separate standoffs are solder elements.

13. The electronic package of claim 8 wherein said separate standoffs are electronic components.

14. The electronic package of claim 13 wherein said separate standoffs are semiconductor chip and solder ball assemblies.

15. The electronic package of claim 1 wherein said separate standoffs comprise extension portions of said heat sink.

16. The electronic package of claim 1 wherein said heat shrunk adhesive comprises silicone.

17. The electronic package of claim 1 further including a printed circuit board, said flexible circuit of said electronic package being electrically coupled to said printed circuit board to form an electrical assembly.

18. A method of making an electronic package comprising:
providing a heat sink; providing a flexible circuit including a plurality of conductors thereon;
positioning a semiconductor chip on said flexible circuit and electrically coupling said semiconductor chip to selected ones of said conductors;
positioning a quantity of heat shrinkable adhesive in liquidus form between said flexible circuit and said heat sink in contact with both said flexible circuit and said heat sink;
substantially shrinking said heat shrinkable adhesive to cause said heat shrinkable adhesive to shrink from the volume of its liquidus form to a lesser volume so as to bond said flexible circuit to said heat sink such that said flexible circuit having said semiconductor chip positioned thereon is substantially planar; and positioning a plurality of separate standoffs substantially between said heat sink and said flexible circuit to maintain at least part of said flexible circuit at a spaced distance from said heat sink when said flexible circuit is substantially planar; wherein at least one of the plurality of separate standoffs does not contact the heat shrinkable adhesive, and wherein at least one of the plurality of separate standoffs is positioned within the heat shrinkable adhesive.

19. The method of claim 18 wherein said positioning of said semiconductor chip on said flexible circuit and electrically coupling said semiconductor chip to selected ones of said conductors is accomplished using solder balls.

20. The method of claim 18 wherein said positioning of said quantity of heat shrinkable adhesive in liquidus form between said flexible circuit and said heat sink in contact with both said flexible circuit and said heat sink is accomplished using a dispenser nozzle.

21. The method of claim 18 wherein said substantially curing of said heat shrinkable adhesive to cause said heat shrinkable adhesive to shrink from the volume of its liquidus form to a lesser volume so as to bond said flexible circuit to said heat sink such that said flexible circuit having said semiconductor chip positioned thereon is substantially planar is accomplished by exposing said heat shrinkable adhesive to air at room temperature for a predetermined time period.

22. The method of claim 18 wherein said substantially curing of said heat shrinkable adhesive to cause said heat shrinkable adhesive to shrink from the volume of its liquidus form to a lesser volume so as to bond said flexible circuit to said heat sink such that said flexible circuit having said semiconductor chip positioned thereon is substantially planar is accomplished by exposing said heat shrinkable adhesive to heat at an established temperature for a predetermined time period.

23. The method of claim 22 wherein said established temperature is within the range of from about 140 degrees Celsius to about 160 degrees Celsius and said predetermined time period is from about 30 minutes to about 120 minutes.

24. The method of claim 18 wherein said positioning of said plurality of separate standoffs substantially between said heat sink and said flexible circuit to maintain at least part of said flexible circuit at a spaced distance from said heat sink when said flexible circuit is substantially planar includes positioning at least one of said separate standoffs contiguous with said heat shrinkable adhesive.

* * * * *